(12) United States Patent
Korenaga

(10) Patent No.: US 6,479,991 B1
(45) Date of Patent: Nov. 12, 2002

(54) STAGE MECHANISM, EXPOSURE APPARATUS AND DEVICE MANUFACTURING METHOD IN WHICH A COIL UNIT OF A DRIVING MECHANISM IS MOVED SUBSTANTIALLY IN SYNCHRONISM WITH A STAGE

(75) Inventor: Nobushige Korenaga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/283,191

(22) Filed: Apr. 1, 1999

(30) Foreign Application Priority Data

Apr. 1, 1998 (JP) .............................. 10-088685

(51) Int. Cl.$^7$ .......................... G01R 33/00; H01L 21/30

(52) U.S. Cl. .......................... 324/226; 324/262; 355/53

(58) Field of Search .............................. 324/226, 228, 324/207.11, 262; 355/53; 74/471 XY; 318/653, 652

(56) References Cited

U.S. PATENT DOCUMENTS

| | | | |
|---|---|---|---|
| 5,260,580 A | 11/1993 | Itoh et al. | 250/492.2 |
| 5,285,142 A | 2/1994 | Galburt et al. | 318/640 |
| 5,467,720 A | 11/1995 | Korenaga et al. | 108/20 |
| 5,518,550 A | 5/1996 | Korenaga et al. | 118/729 |
| 5,537,186 A | 7/1996 | Korenaga et al. | 355/53 |
| 5,684,856 A | 11/1997 | Itoh et al. | 378/34 |
| 5,841,250 A | * 11/1998 | Korenage et al. | 310/12 |
| 6,150,787 A | * 11/2000 | Lee | 74/471 XY |

* cited by examiner

Primary Examiner—Walter E. Snow
(74) Attorney, Agent, or Firm—Fitzpatrick, Cella, Harper & Scinto

(57) ABSTRACT

A stage system includes a movable stage, a first driving mechanism, having magnet and a coil unit, for moving the stage along a predetermined direction, the coil unit including a coil and a yoke, wherein the magnet is connected to the stage side, and a second driving mechanism for moving the coil unit along the predetermined direction. While a position or a speed of the stage is controlled as the stage is driven through the first driving mechanism, the coil unit is moved substantially in synchronism with the stage.

26 Claims, 14 Drawing Sheets

STAGE MECHANISM, EXPOSURE APPARATUS AND DEVICE MANUFACTURING METHOD IN WHICH A COIL UNIT OF A DRIVING MECHANISM IS MOVED SUBSTANTIALLY IN SYNCHRONISM WITH A STAGE

FIELD OF THE INVENTION AND RELATED ART

This invention relates generally to a stage system for precisely positioning an article carried thereon. In another aspect, the invention is concerned with an exposure apparatus having such a stage system for positioning a wafer on a reticle, and also with a device manufacturing method using such an exposure apparatus.

FIG. 14 shows an example of a conventional stage system. A guide 52 is fixed on a base, not shown. A stage 51 which is slidably movable along a driving direction is supported by the guide. A workpiece 60 is placed on the stage. There are linear motors disposed on the opposite sides of the stage 51, for moving the stage in the driving direction. Linear motor stators 53 each comprise six flat coils 56 fixed to a stator frame 57, and they are fixed to the base, not shown, through fixing members, not shown.

A movable element 54 of the linear motor comprises an integral structure of four-pole magnets 58, being magnetized in the vertical direction, and yoke plates 55 which are disposed above and below the stator unit and fixed to the stage 51 without contact to the stator element 53. The six coils 56 are disposed along the driving direction at a pitch 1.5 times the pitch of the magnetic poles. The coil pitch corresponds to a 0.75 period of the basic wave of the magnetic density and, in terms of electric angle, to 270 deg. or −90 deg.

While the relative position of the coils 56 and the magnets 58 is detected by means of a sensor, not shown, coils 56 at positions spaced by 270 deg. or −90 deg. are selected sequentially and electric currents are supplied to them in an appropriate direction, whereby the magnets are driven In the same direction. Although the coil means has six phases in the sense that the coils 56 are interchanged sequentially, the motor comprises a two-phase motor.

In the stage system of the structure described above, an integral structure of yokes and magnets is moved. Therefore, the weight of movable components is large and stage acceleration is slow. Also, there occurs thrust ripple due to the coil interchanging during the driving. This is an external disturbance, disturbing high-precision positioning control.

FIG. 15 shows another example of a conventional stage system. A guide 52 is fixed on a base, not show. A stage 51 which is slidably movable along a driving direction is supported by the guide 52. A workpiece, not show, is placed on the stage, There are movable magnets 58 disposed on the opposite sides of the stage 51, and they are held by holding frames 59. Stators 53 to be associated with these movable magnets 58 each comprise single-phase colis 56 extending throughout the whole stroke of the stage 51. Each coil 56 is wounded coaxially around an upper yoke 55a or a lower yoke 55b, extending through the whole stroke.

In order to prevent eddy current resistance to be produced during relative motion of the magnets 58 and yokes 55, each yoke 55 comprises laminated steel plates as shown in the drawing.

In the structure described above, in response to supply of electric current to the single-phase coil 56, forces in the same direction and corresponding to the electric current are produced at every location within the stroke. Thus, only application of electric current in a desired direction is necessary. No coil interchanging is necessary throughout the stroke.

Since, however, in the stage system described above, high-speed relative motion between the magnets and yokes causes an eddy current in the yokes which applies a resistive force to the relative motion of the magnets and yokes. If the eddy current resistance is large, a large driving force is necessary for the stage. The yoke may be provided by laminated steel plates to solve this problem. However, assembling such long steel plages is not easy, and also supporting the yoke after assemblage is not easy. It is, therefore, practically difficult to produce a yoke of a complicated shape by use of laminated steel plates. Consequently, the yoke has a large weight.

Further, there is an attraction force caused between the yoke and magnet. If the stoke, that is, the length of the yoke, is large, flexure of the yoke as the magnet comes to the central portion of the stroke becomes large. Also, the flexure changes largely between the moment where the magnet is at the central portion and the moment where it is at an end portion. This excites vibration of the yoke. For these reasons, the yoke should be formed with a sectional area larger than that as required only for passage of the magnetic flux, to thereby reduce the absolute value of flexure. This means a large increase in dimension of the required sectional area. The increase in size of the yoke necessarily leads to an increase of mass of the yoke and, in contrast to reduction in weight of movable components, the stator becomes very heavy. Finally, when an X-Y stage mechanism is provided by a simple two-level structure, the movable stage must include a portion, having such a very heavy yoke, and a large acceleration is difficult to accomplish to such portion. Further, what is contributable to production of thrust is only the portion of the coil structure which is opposed to the magnet, and most of the apparatus is unnecessary with respect to the thrust production. Also, there is no large or unnecessary heat generation.

SUMMARY OF THE INVENTION

It is an object of the present invention to provide an improved high-speed and high-precision stage system, by which at least one of the problems described above can be solved.

In accordance with an aspect of the present invention, there is provided a stage system, comprising: a movable stage; a first driving mechanism having a magnet and a coil, for moving said stage along a predetermined direction; and a second driving mechanism for moving said first driving mechanism along the predetermined direction; wherein one of said magnet and said coil of said first driving mechanism is connected to the stage side, while the other is connected, together with a yoke, to the second driving mechanism side: and wherein, while a position or a speed of said stage is controlled as said stage is driven through said first driving mechanism, one of said magnet and said coil of said first driving mechanism connected to said second driving mechanism is moved substantially in synchronism with said stage.

In one preferred form of this aspect of the present invention, said magnet is provided at the stage side while said coil is provided at the second driving mechanism side. Said second driving mechanism may include a feed screw. Said second driving mechanism may include a linear motor. Said magnet and said coil may have substantially the same size with respect to the movement direction. Said yoke may comprise a ferromagnetic material of flat plate shape. Said coil may be wound around said yoke. Said coil may comprise a flat coil. Said first driving mechanism may include a plurality of coils. Said first driving mechanism may be operable to move the movable member two-dimensionally. Said coil may comprise a first coil for producing a driving force in a first direction with respect to said magnet, and a second coil for producing a driving force in a second direction with respect to said magnet. Said second driving mechanism may be operable to move, two-dimensionally, one of said magnet and said coil of said first driving mechanism as connected to said second driving mechanism. Said yoke may have a recess formed in a peripheral portion thereof.

In accordance with another aspect of the present invention, there is provided an exposure apparatus, comprising: a stage being movable while holding one of a wafer and a reticle thereon; a first driving mechanism having a magnet and a coil, for moving said stage along a predetermined direction; and a second driving mechanism for moving said first driving mechanism along the predetermined direction; wherein one of said magnet and said coil of said first driving mechanism is connected to the stage side, while the other is connected, together with a yoke, to the second driving mechanism side; and wherein, while a position or a speed of said stage is controlled as said stage is driven through said first driving mechanism, one of said magnet and said coil of said first driving mechanism connected to said second driving mechanism is moved substantially in synchronism with said stage.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Embodiment 1

Figure 1:
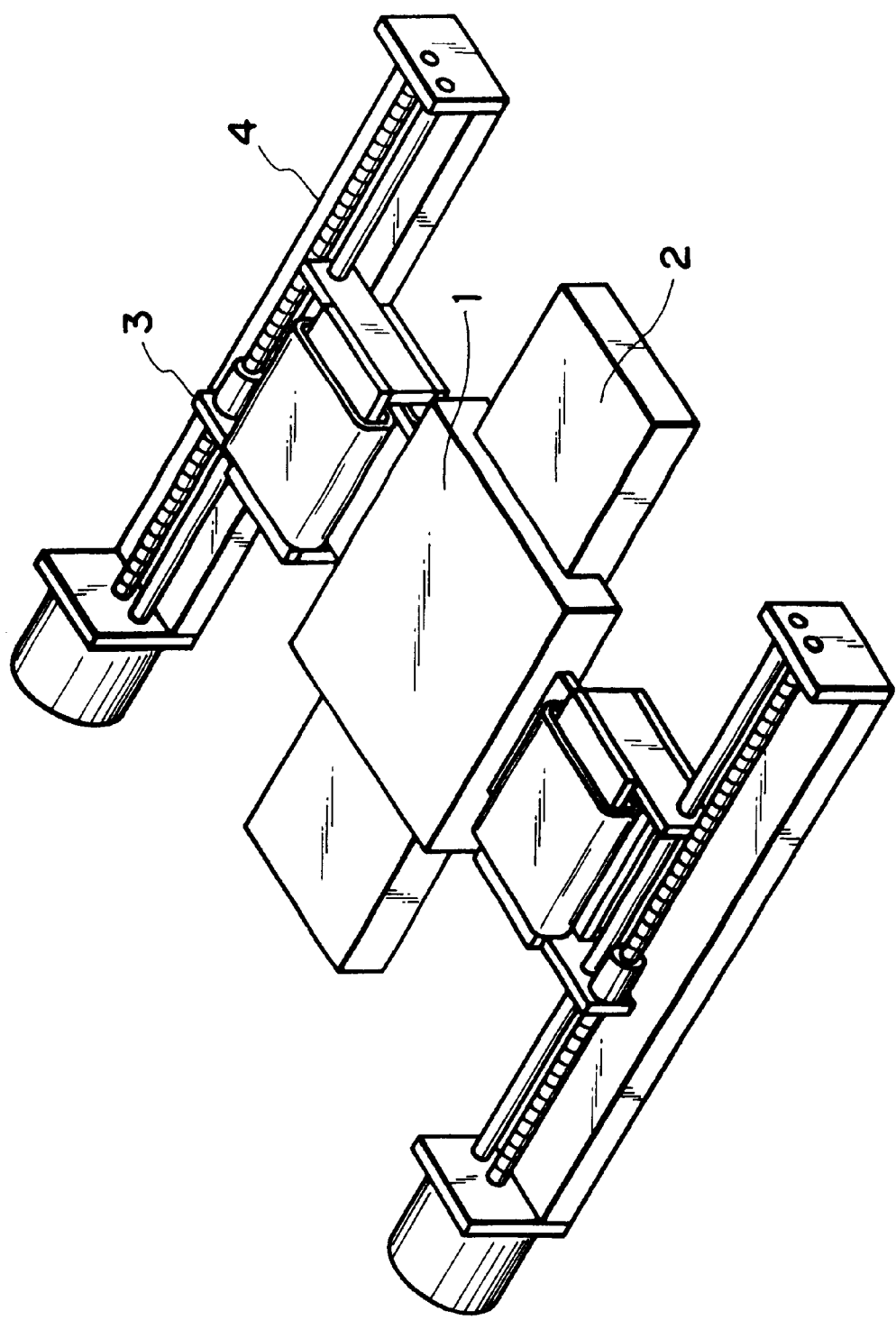
FIG. 1 is a schematic view of a stage system according to a first embodiment of the present inventions.

FIG. 1 shows a stage system according to a first embodiment of the present invention.

A guide 2 is fixed to a base, not shown. A stage 1 is supported by the guide 2 without contact thereto, through static bearing means, not shown. The stage 1 is supported slidably along the longitudinal direction of the guide. A workpiece, not shown, is placed on the stage 1. On the opposite sides of the stage 1, there are single-pole movable magnets 8 which are held by frames 9.

Figure 2:
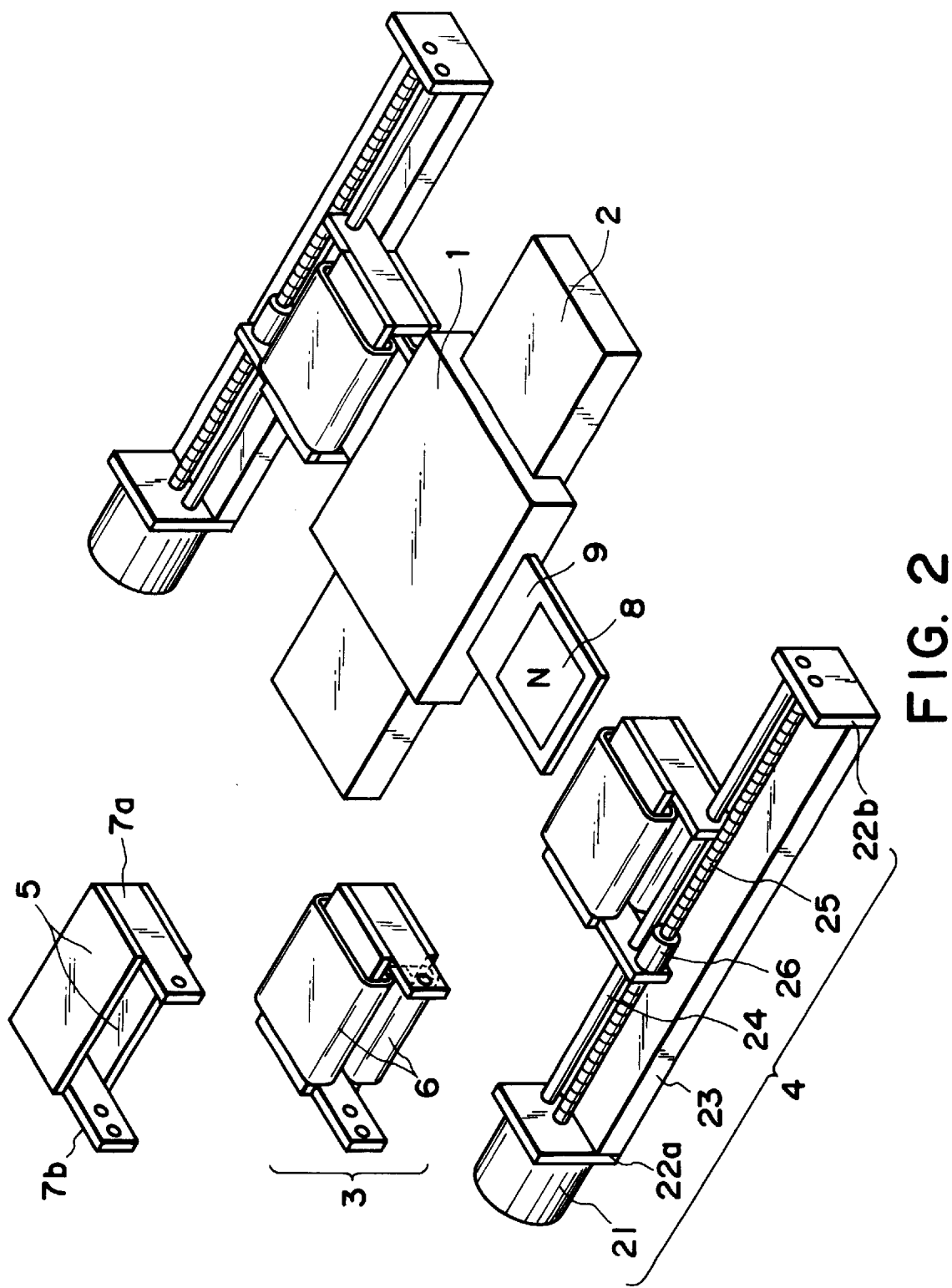
FIG. 2 is a schematic view for explaining details of the stage system of the first embodiment.

Provided on the opposite sides of the stage 1 and the guide 2 are stator moving units 4 (second driving mechanism) and moving type stator 3 (a portion of a first driving mechanism) to be moved by the stator moving units 4 in the movement direction of the stage 1. FIG. 2 illustrates details of the moving type stator 3 and the stator moving unit 4.

The moving type stator 3 comprises two solid yokes 5 of flat plate-like shape, side plates 7*a* and 7*b*, and single-phase coils 6. The solid yoke comprises a solid member made of a ferromagnetic material, and it is not provided by a laminated structure.

The two plate-like yokes 5 are disposed opposed to each other with a predetermined spacing held therebetween. The size of the spacing is determined by the height of the side plates 7*a* and 7*b*, disposed between the yokes 5.

The dimension of the plate-like yoke 5 in the stage movement direction is approximately equal to the sum of the size of the single-pole magnet 8 and the frame 9 with respect to the stage movement direction and the size as supported by the side plate 7. The dimension of the plate-like yoke 5 in a direction perpendicular to the stage movement direction is approximately equal to the size of the single-pole magnet 8 with respect to the stage movement direction.

Around the two plate-like yokes 5, there are single-phase coils 6 wound coaxially. The dimension of the single-phase coil with respect to the stage movement direction is approximately equal to that of the single-pole magnet 8 in the stage movement direction. The dimension of the single-phase coil 6 with respect to a direction perpendicular to the stage movement direction is approximately equal to the size of the single-pole magnet 8 in a direction orthogonal to the stage movement direction. The spacing between the side plates 7*a* and 7*b* is made larger, in design, than the size of the frame 9, holding the single-pole magnets 8, with respect to the stage movement direction.

The stator element moving unit 4 comprises a motor 21, a bracket 22*a*, a support plate 23, a guide bar 24, a feed screw 25, a nut 26, and a bracket 22*b*. The brackets 22*a* and 22*b* are fixed to the opposite sides of the support plate. The brackets 22*a* and 22*b* are formed with guide bar fixing bores and feed screw supporting bearings, not shown. The guide bar 24 is fixed by the guide bar fixing bores of the brackets 22*a* and 22*b*. The feed screw 25 is rotatably supported by the supporting bearings of the brackets 22*a* and 22*b*. The motor 25 has its casing fixed to the bracket 22*b*, and a rotational shaft thereof is connected to the feed screw 25. The nut 26 engages with the feed screw 25.

The moving type stator element 3 is mounted on the stator moving unit 4. The side plate 7a of the moving type stator 3 is formed with a guide bore, while the side plate 7b thereof is formed with a guide bore and a driving bore. The guide bore has a dimension to be precisely fitted with the guide bar 24 of the stator moving unit 4, and the driving bore has a dimension having an appropriate spacing with the feed screw 25 of the moving unit 4. The guide bar 24 extends through the guide bores of the side plates 7a and 7b, and it supports the moving type stator 3 slidably movably along the stage movement direction. The feed screw 25 extends through the driving bore of the side plate 7b with an appropriate gap to it, and the nut 26 is fixed to the side plate 7b. With the structure described above, rotation of the rotary shaft of the motor 21 causes motion of the moving type stator 3 in the stage movement direction, through the feed screw 25.

The stator moving unit 4 is fixed to a base, not shown, so that the single-phase coils 6 of the stator 3 and the single-pole magnet 8 held by the stage frame 9 are kept out of contact to each other. Further, with respect to the single-pole magnet 8 and in the vertical direction, the two plate-like yokes 5 are disposed approximately at the same distance such that the attraction forces of the single-pole magnet 8 and the yokes 5 are substantially canceled. With this structure, there is substantially no force produced which is influential to deforming the stage 1.

In the horizontal direction, the magnet and the yoke have substantially the same dimension, and, therefore, the supporting span for the yoke 5 is very small as compared with conventional structures. If, therefore, an attraction force is applied between the magnet 8 and the yoke 5, the amount of flexure of the yoke is kept very small. The required sectional area of the yoke 5 can, therefore, be determined by the magnetic flux of the magnet, passing through the yoke. A larger sectional area, more than it, is necessary.

Since the size of the yoke 5 in the stage movement direction can be reduced and also the sectional area of the yoke 5 can be made small, the mass of the yoke can be reduced.

To move the stage 1 in the structure described above, electric currents are applied to the single-phase coils 6 at the opposite sides to produce a Lorentz force between the coil 6 and magnet 8 and, simultaneously, the motor 21 of the stator moving unit 4 is driven to move the stator 3 approximately in synchronism with the stage 1.

Precise movement following control for the moving type stator 3 is unnecessary. Open feeding, to prevent contact between the side plate 7a or 7b and the stage side frame 9, holding the single-pole magnets, will be sufficient.

The property of the motion of the stage 1 responsive to the electric current waveform applied to the single-phase coil can be predetermined, from the relationship between the electric current to be applied to the single-phase coil 6 and the Lorentz force produced between the single-phase coil 6 and the single-pole magnet 8, and from the mass of the stage. Therefore, the driving amount of the motor 21 and the stator moving unit 4 can be predetermined and, thus, open driving may be performed. As a result of this, the relative speed between the magnet 8 and the yoke 5 can be kept substantially zero even during high-speed movement of the stage 1. Therefore, it is unnecessary to take into account the eddy current attributable to the relative motion of the magnet 8 and the yoke 5. Thus, the yoke can be made by a solid plate-like member of ferromagnetic material, rather than a laminated structure.

The position of the stage 1 in the direction to be guided is measured by means of a high-resolution position sensor (not shown) such as a laser interferometer, for example. A deviation with respect to a target value is calculated by a control calculator (not shown), and the result is applied as an electric current signal to a current amplifier (not shown) which is connected to the single-phase coils 6, whereby high-precision control is performed.

While in the described example the stator moving unit 4 for moving the stator element 3 has the motor 21 and the feed screw 25, only the function for moving the stator in the stage movement direction is required therefor, and driving means such as a linear motor, a pneumatic cylinder, a hydraulic cylinder, or a multi-articulation robot, for example, may be used.

In the stage system of this embodiment, the moving type stator 3 having coils 6 opposed to the magnet 8 fixed to the stage 1 is moved through the stator moving unit 4 in synchronism with the stage. Therefore, the position or speed of the stage 1 can be controlled without contact. Further, there occurs no thrust ripple due to coil interchanging (which occurs in the case of a multi-phase linear motor), and therefore external disturbance can be reduced. Since the moving type stator which is capable of performing precise positioning can be moved by the moving unit through a wide range, high precision positioning can be accomplished throughout a wide range.

The dimension of the yoke 5 in the stage movement direction can be reduced significantly. This reduces flexure of the yoke 5 and effectively prevents vibration thereof. Reduction of flexure avoids enlargement of the sectional area of the yoke 5, and the yoke can be made light. This is effective to lightening the stage system. Further, since the yoke moves together with the magnet, there occurs no change in flexure of the yoke due to the stage movement.

In the stage system of the embodiment, the moving type stator 3 having coils 6 opposed to the magnet 8 fixed to the stage 1 is moved through the stator moving unit 4 is synchronism with the stage. Therefore, the position or speed of the stage 1 can be controlled without contact. Further, there occurs no thrust ripple due to coil interchanging (which occurs in the case of a multi-phase linear motor), and therefore external disturbance can be reduced. Since the moving type stator which is capable of performing precise positioning can be moved by the moving unit through a wide range, high precision positioning can be accomplished throughout a wide range.

In this embodiment, the magnet is placed on the stage side while the coil is placed on the stator moving unit side (second driving mechanism side). However, similar advantageous results are attainable with reverse disposition of magnet and coil. However, placing the magnet (magnet means of the first driving mechanism) for driving the moving element on the moving element side may be preferable, since it avoids the necessity of wiring the moving element for the coil and thus the wire cable to the moving element can be made light. This puts an additional advantage of reducing disturbance to the moving element, due to flexure of the wire cable.

Figure 3:
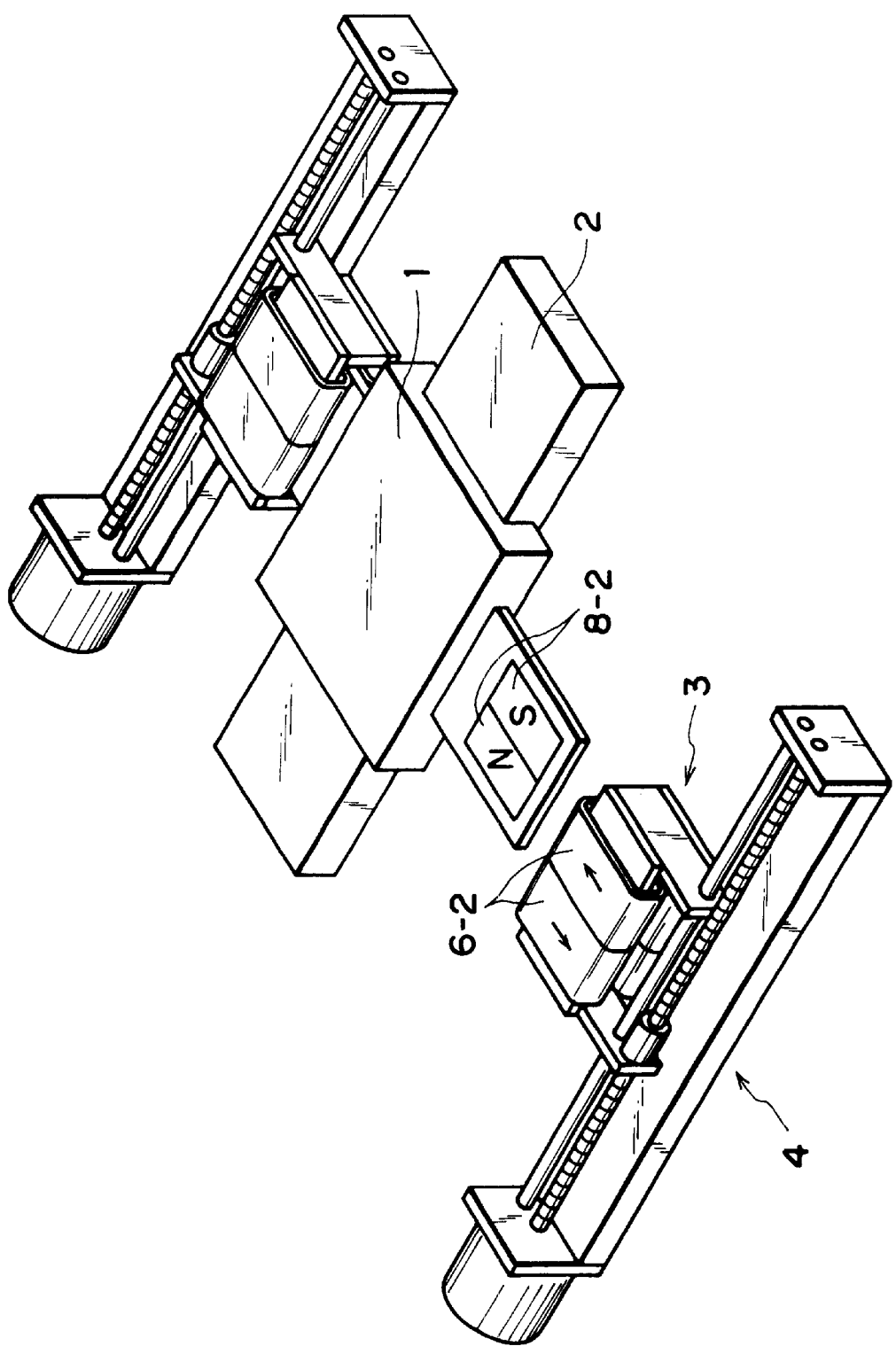
FIG. 3 is a schematic view of a stage system according to a second embodiment of the present invention.

FIG. 3 shows a stage system according to a second embodiment of the present invention. In this embodiment, the single-pole magnets of the first embodiment which are fixed to the stage are replaced by dual-pole magnets 8-2 while the single-phase coils are replaced by a dual-phase coil 6-2. The remaining portion has substantially the same structure as that of the first embodiment.

Two-pole magnets 8-2 held by frames 9, on the sides of the stage 1, are magnetized in vertical directions, and they are disposed oppositely to each other along the movement direction of the stage 1. Two coils, constituting a dual-phase coil 6-2, are wound coaxially around a plate-like yoke 5, and they are placed along the movement direction of the stage 1. In this embodiment, electric currents are applied to the dual-phase coil 6-2 continuously in opposite directions. With this structure, while the function is the same as that of the preceding embodiment, there is an advantage that magnetic fluxes produced by coils of two phases are oriented in mutually cancelling directions, such that the electric current response is improved.

While this embodiment uses dual-pole magnet 8-2 and dual-phase coil 6-2, the structure may comprise an M-pole magnet and an M-phase coil where M is an even number.

In addition to the advantages described adove, this embodiment also assures the advantageous results of the preceding embodiment.

Embodiment 3

Figure 4:
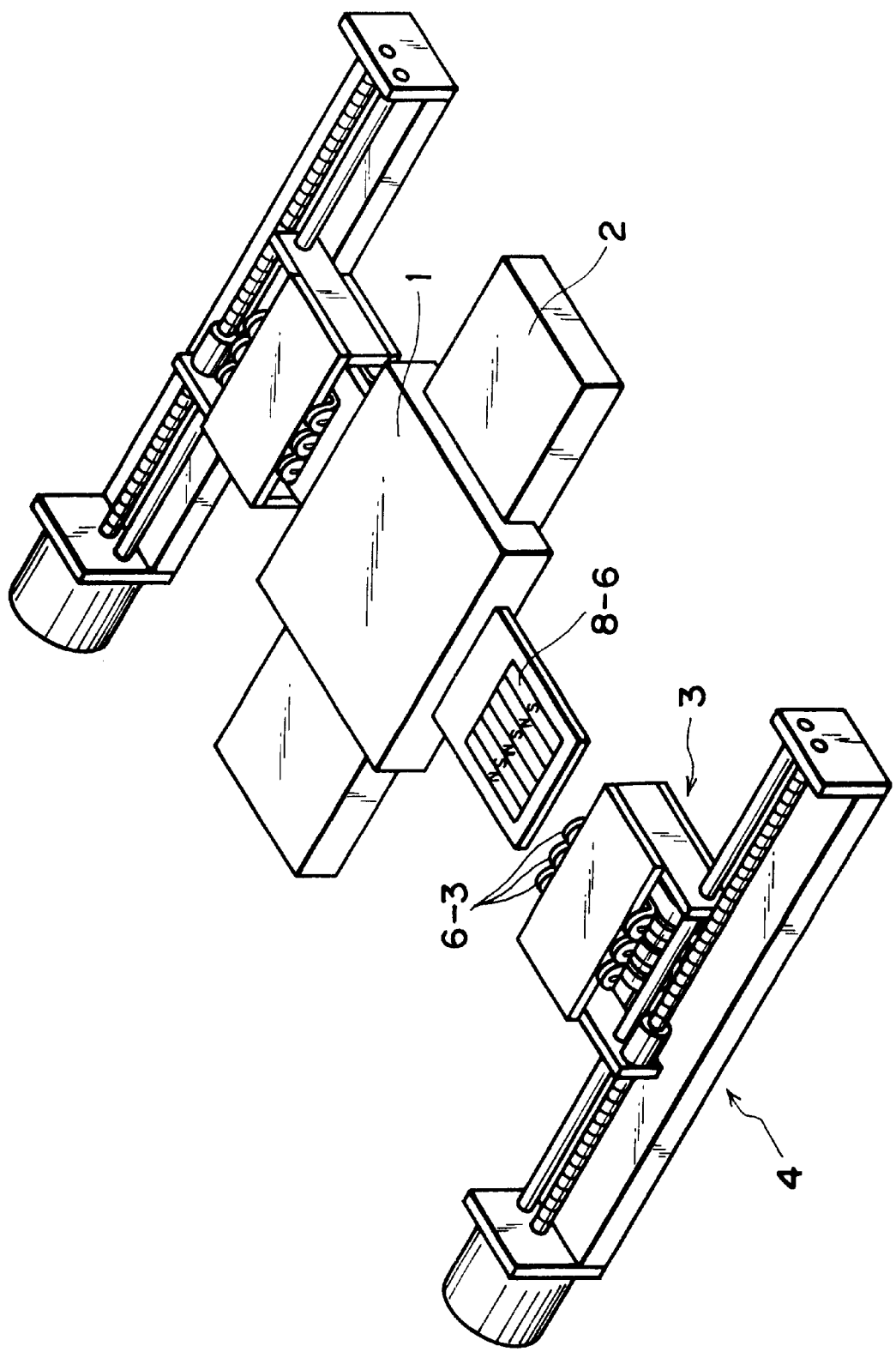
FIG. 4 is a schematic view of a stage system according to a third embodiment of the present invention.

FIG. 4 shows a stage system according to a third embodiment of the present invention. FIG. 5 shows details of a moving type stator and a stator moving unit of the stage system of this embodiment.

In this embodiment, in place of coils wound coaxially around a yoke as in the preceding embodiment, a flat coil is used.

Figure 5A:
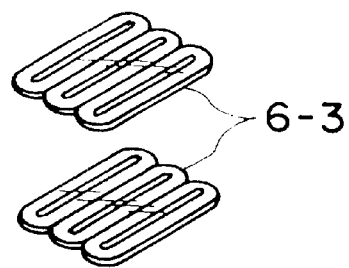
FIGS. 5 (*a*) through 5 (*d*) are schematic views for explaining details of a movable type stator and a stator moving unit, in the stage system of the third embodiment.
Figure 5B:
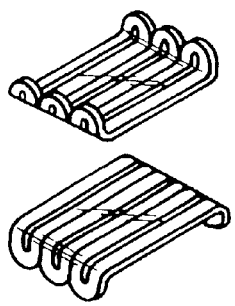
Figure 5C:
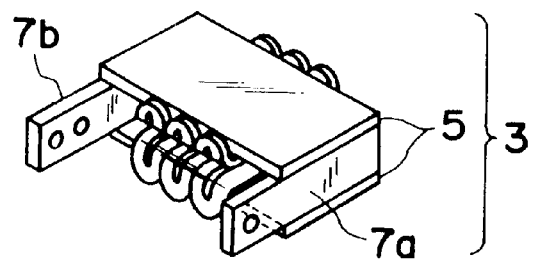
Figure 5D:
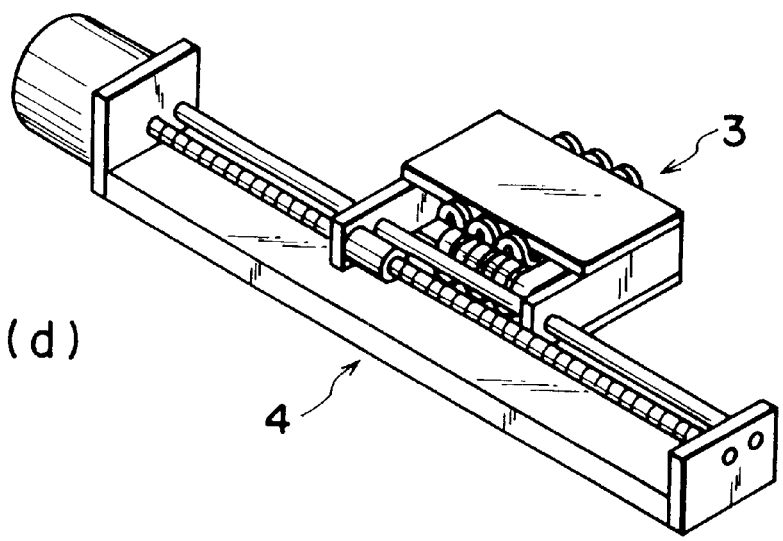

In FIG. 5(a), there are upper and lower arrays of three flat coils 6-3. Opposite ends of the three flat coils of the upper array are bent upwardly as shown FIG. 5(b), while the opposite ends of the three flat coils in the lower array are bent downwardly. This is to avoid horizontally protruded portions of coils which are not contributable to production of thrust. Subsequently, as show at FIG. 5(c), the three bent flat coils in the upper array are fixed to an upper plate-like yoke 5, while the three bent flat coils of the lower array are fixed to a lower plate-like yoke. The upper and lower plate like yokes are connected to each other while the spacing therebetween is adjusted by side plates 7a and 7b, whereby a moving type stator 3 is provided. The moving type stator 3 and the stator moving unit 4 are combined with each other, as show in FIGS. 5(a) to 5(d).

On the other hand, the magnet portion to be opposed to the stator 3 is provided by a six-pole magnet 8-6 as shown in FIG. 4. When electric currents are applied to the flat coils shown in FIGS. 5(a) to 5(d) in the same direction, electric currents at the straight portions of the flat coils, at adjacent coil sides, are in opposite directions. Thus, in order to produce a force with respect to a single flat coil, it is necessary that the magnet pole is changed in accordance with the region at the coil side (i.e., to provide dual poles). Since there are three upper coils and three lower coils to be opposed to the magnet, six magnetic poles are necessary. The region of the six-pole magnet corresponds to the region of the straight portion of the flat coils where the electric currents are in the same direction.

The structure, dimensional relation and positional relation of the remaining portion are essentially the same as those of the preceding embodiment and, therefore, the functions and advantageous results are also substantially the same.

In this embodiment, each coil is a core-less coil having no iron core, and there is an advantage of improved current response. Further, the portion of the coil not contributable to thrust production is small. This effectively leads to reduced heat generation.

The number of flat coils and the number of magnet poles are not limited to those of this embodiment.

Embodiment 4

Figure 6:
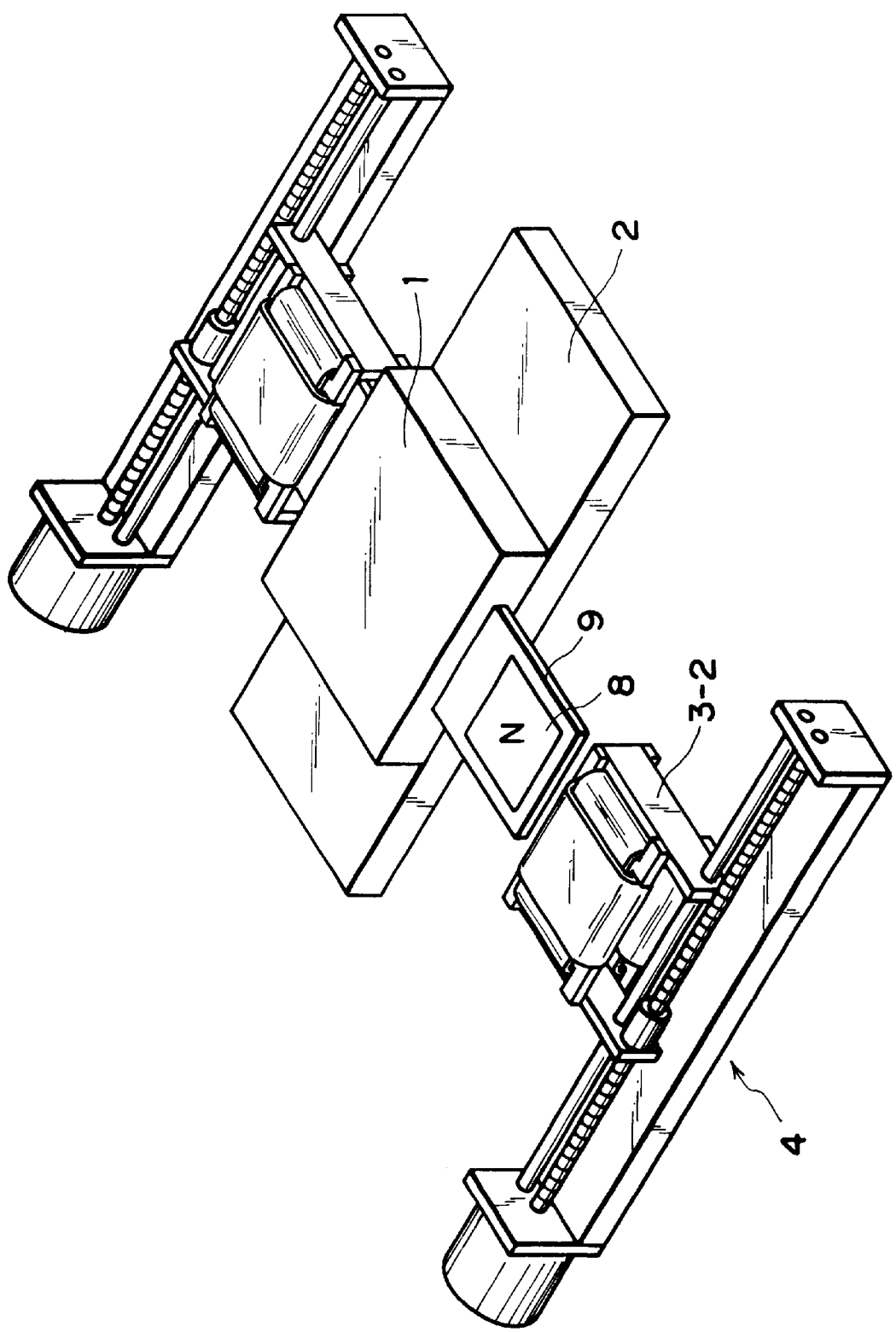
FIG. 6 is a schematic view of a stage system according to a fourth embodiment of the present invention.

FIG. 6 shows a stage system according to a fourth embodiment of the present invention.

A stage 1 is supported on a guide 2, fixed to a base (not shown), for sliding motion on the top surface of the guide in rotational direction, in lengthwise direction of the guide and in a direction orthogonal to the guide lengthwise direction. The stage 1 is supported by the guide through static bearing means, not shown. A workpiece (not shown) is placed on the stage. There are single-pole movable magnets 8 disposed on the opposite sides of the stage 1, and they are held by frames 9. The position of the stage 1 with respect to the lengthwise direction of the guide 2 and the direction perpendicular to the guide lengthwise direction as well as the rotational direction, is measured by means of a three-axis laser interferometer, not shown.

As shown in the drawing, the stage 1 is movable on the guide 2 horizontally (in the guide lengthwise direction and in a direction perpendicular thereto). Any deviation of the position thereof in the horizontal direction or its rotational position with respect to a certain target position, can be measured by the laser interferometer and then it can be corrected by means of a linear motor, to be described.

Figure 7:
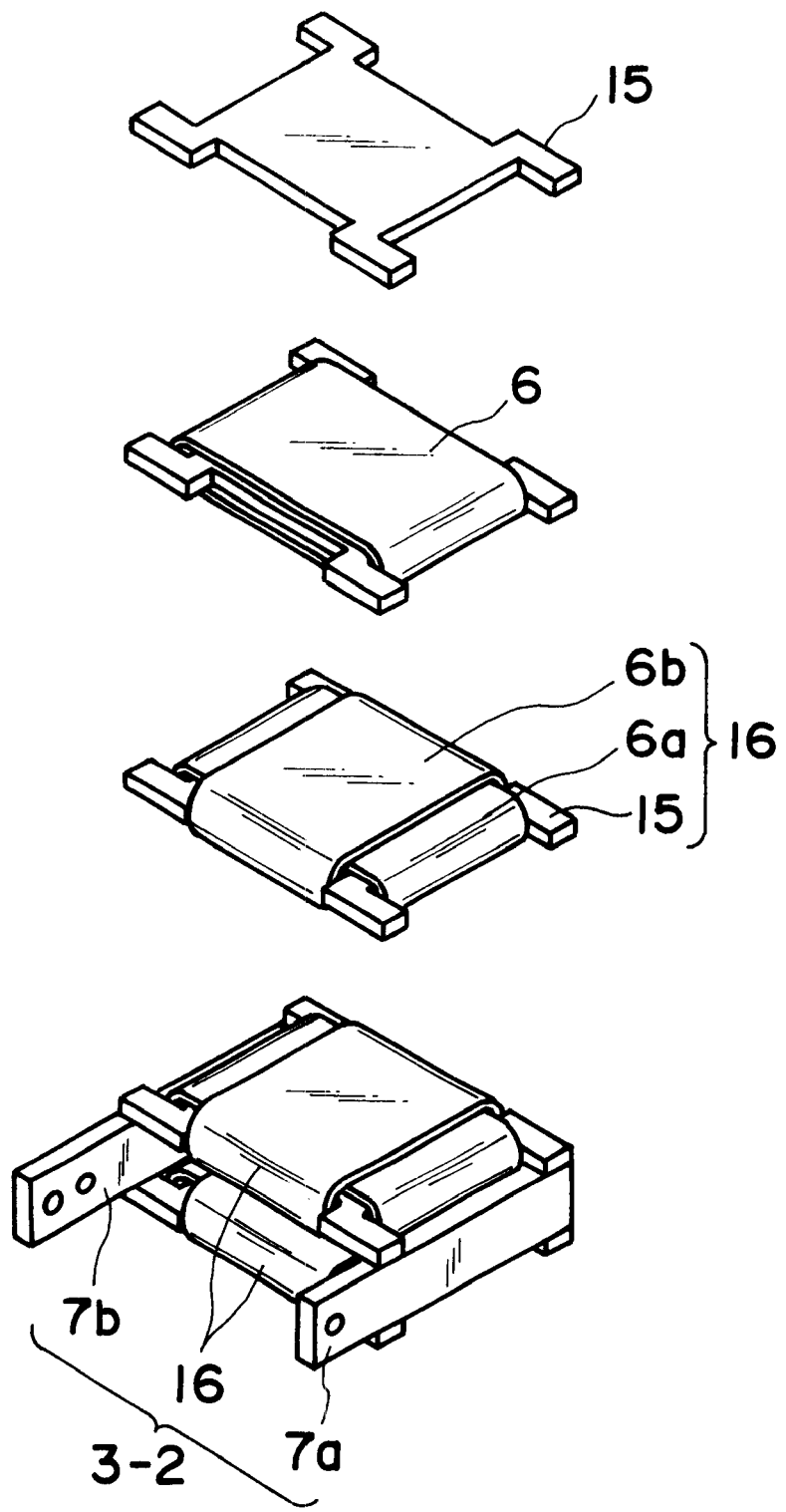
FIG. 7 is a schematic view for explaining details of a movable type two-dimensional stator, in the stage system of the fourth embodiment.

Provided on the opposite sides of the stage 1 and the guide 2 are stator moving units (second driving mechanism) and moving type two-dimensional stators (coil means of first driving means) to be moved by the stator moving units in the stage movement direction. FIG. 7 shows details of the moving type two-dimensional stator. The stator moving unit 4 has substantially the same structure as that of the preceding embodiment.

The moving type two-dimensional stator element 3-2 comprises two frog-shaped plate-like yokes 15, side plates 7a and 7b, and two single-phase coils 6 wound around the yoke in mutually orthogonal directions. Each yoke 15 comprises a plate-like member of rectangular shape, formed with recesses a–b at four sides thereof. Thus, when the two coils are wound around it, the yoke has four legs to be connected to the side plate 7a or 7b, being protruded from the four corners of the yoke. The plate-like yoke is provided by a solid member of ferromagnetic material, rather than by a laminated structure, as in the preceding embodiments.

The distance between the recesses a and b of the frog-shaped yoke 15 is approximately equal to the size of the single-pole magnet 8 and the frame 9 in the stage movement direction. The distance between the recesses c and d of the yoke 15 is approximately equal to the size of the single-pole magnet 8 in the direction perpendicular to the stage movement direction.

Each of the two frog-shaped yokes 15 has two single-phase coils 6a and 6b which are wound around it so that their straight portions extend mutually orthogonally. The dimension of the single-phase coil 6a in the stage movement direction is approximately equal to the size of the single-pole magnet 8 in the same direction. The dimension of the single-phase coil 6b in the direction perpendicular to the stage movement direction is approximately equal to the size of the single-pole magnet 8 in the corresponding direction. Also, the dimension of the single-phase coil 6b with respect to the stage movement direction is approximately equal to the size of the magnet 8 in the stage movement direction. The dimension of the coil 6b in the direction perpendicular to the stage movement direction is approximately equal to the size of the magnet 8 in the direction perpendicular to the stage movement direction.

The frog-shaped yoke 15 having single-phase coils 6a and 6b wound around it with their straight portions extending mutually orthogonally, provides a two-dimensional coil unit 16.

There are two two-dimensional coil units 16 which are disposed opposed to each other with a predetermined spacing therebetween. The size of the spacing is determined by the height of the side plates 7a and 7b mounted between the two frog-shaped yokes 15. The spacing between the side plates 7a and 7b is made, in design, larger than the size of the frame 9 in the stage movement direction, by which frame the single-pole magnets 8 are supported. The stator element moving units 4 are like those of the preceding embodiments and, when they are combined with the moving type two-dimensional stators 3-2, the structure shown in FIG. 6 is provided.

In the structure described above, the function and operation as the stage is moved along the lengthwise direction of the guide 2 are essentially the same as those of the preceding embodiments. Namely, electric currents are applied to the single-phase coils 6b at the opposite sides to produce a Lorentz force between the coil 6 and the magnet 8 and, simultaneously therewith, the motor 21 of the stator moving unit 4 is actuated to move the moving type two-dimensional stator element 3-2 in the guide lengthwise direction substantially in synchronism with the stage.

Precise movement following control for the moving type two-dimensional stator 3-2 is unnecessary. Open feeding, to prevent contact between the side plate 7a or 7b and the stage side frame 9, holding the single-pole magnets 8, will be sufficient.

The property of the motion of the stage 1 responsive to the electric current waveform applied to the single-phase coil 6b can be predetermined, from the relationship between the electric current to be applied to the single-phase coil 6b and the Lorentz force produced between the single-phase coil 6b and the single-pole magnet 8, and from the mass of the stage. Therefore, the driving amount of the motor for the stator moving unit 4 can be predetermined and, thus, open driving may be performed. As a result of this, the relative speed between the magnet 8 and the yoke 15 can be kept substantially zero even during high-speed movement of the stage 1. Therefore, it is unnecessary to take into account the eddy current attributable to the relative motion of the magnet 8 and the yoke 15. Thus, the yoke can be made by a solid plate-like member of ferromagnetic material.

The frog-shaped plate-like yoke 15 may be replaced by an oblong-shape plate-like yoke, even by which a moving type two-dimensional stator 3-2 with similar functions can be provided. With such an oblong-shape yoke, however, the useless portion of the coil (the region not contributable to thrust) enlarges by an amount corresponding to the sum of the depths of the recesses a–d, and this leads to an increase of heat generation. In the present embodiment, the yoke can be made by an integral structure of a single plate member of a ferromagnetic material. Therefore, a yoke of a complicated shape can be produced very easily, to provide a moving type two-dimensional stator element.

The position of the stage 1 in the direction to be guided is measured by means of a high-resolution position sensor (not shown) such as a laser interferometer, for example. A deviation with respect to a target value is calculated by a control calculator (not shown), and the result is applied as an electric current signal to a current amplifier (not shown) which is connected to the single-phase coils 6b, whereby high-precision control is performed.

The position of the stage 1 in the direction perpendicular to the guiding direction is measured by means of a laser interferometer, not shown. A deviation with respect to a target value is calculated by a control calculator (not shown), and the result is applied as an electric current signal to a current amplifier (not shown) which is connected to the single-phase coils 6a, whereby high-precision control is performed.

As regards the rotational amount of the stage 1, a deviation of the rotational amount as measured by a laser interferometer (not shown) with respect to a target value is calculated by a control calculator (not shown), and the result is applied as an input difference to two current amplifiers (not shown) connected to the two single-phase coils 6b, whereby high-precision control is performed.

This embodiment uses a stage 1 slidably movable in two-dimensional direction and a moving type stator element 3-2, and this enables three-axis control of the stage 1. Since the stage 1 is slidable two-dimensionally, there is an advantage that no influence of yawing mode is caused due to the spring property of the guide portion.

Because the yoke is provided by a solid plate-like member of a ferromagnetic material, a yoke of complicated shape as having recesses at its sides can be produced very easily. Further, supporting the yoke is easy. The degree of freedom in yoke design is large. The frog-shaped yoke is effective to reduce a useless region of the yoke, which leads to decreased heat generation.

Embodiment 5

Figure 8:
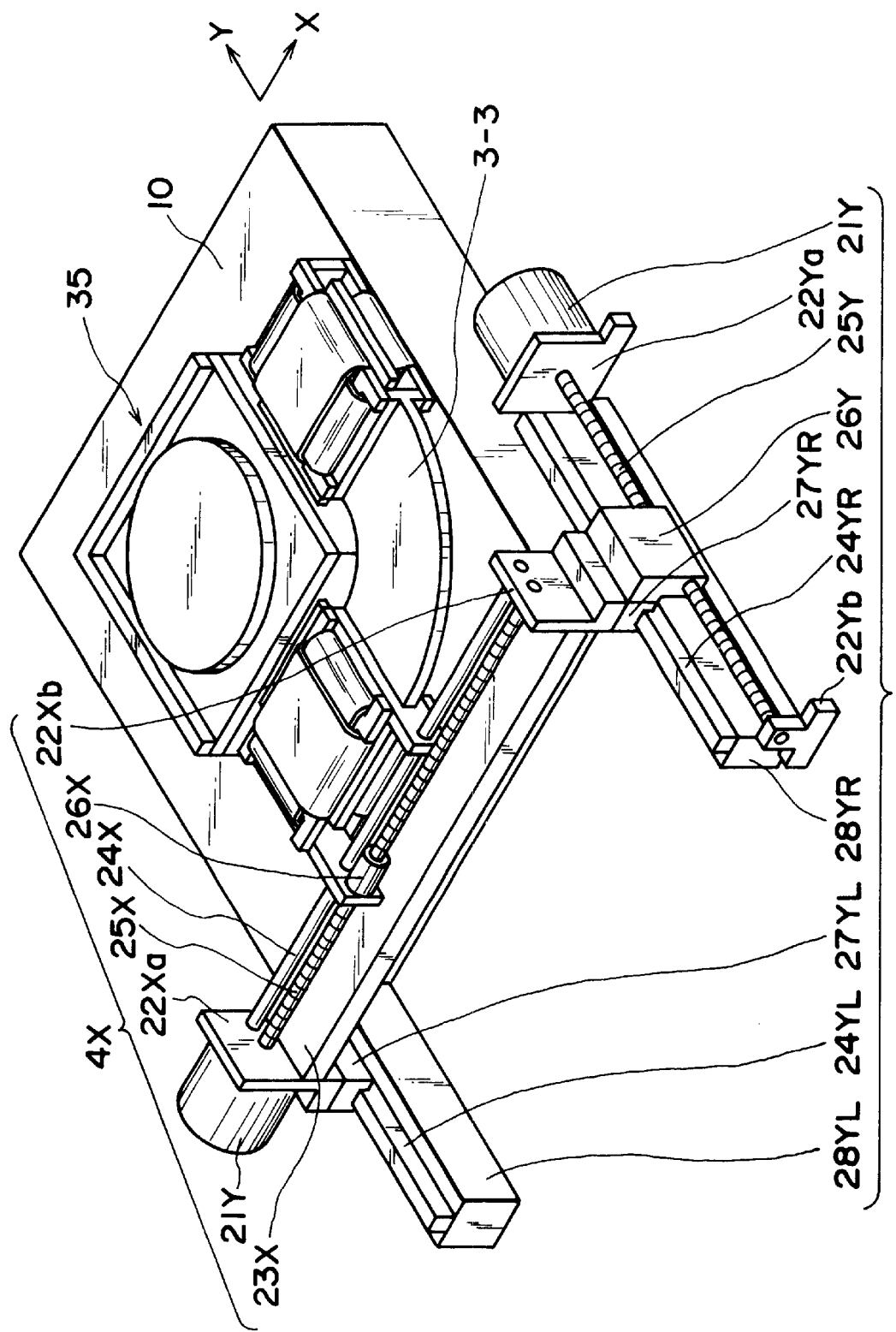
FIG. 8 is a schematic view of a stage system according to a fifth embodiment of the present invention.
Figure 9:
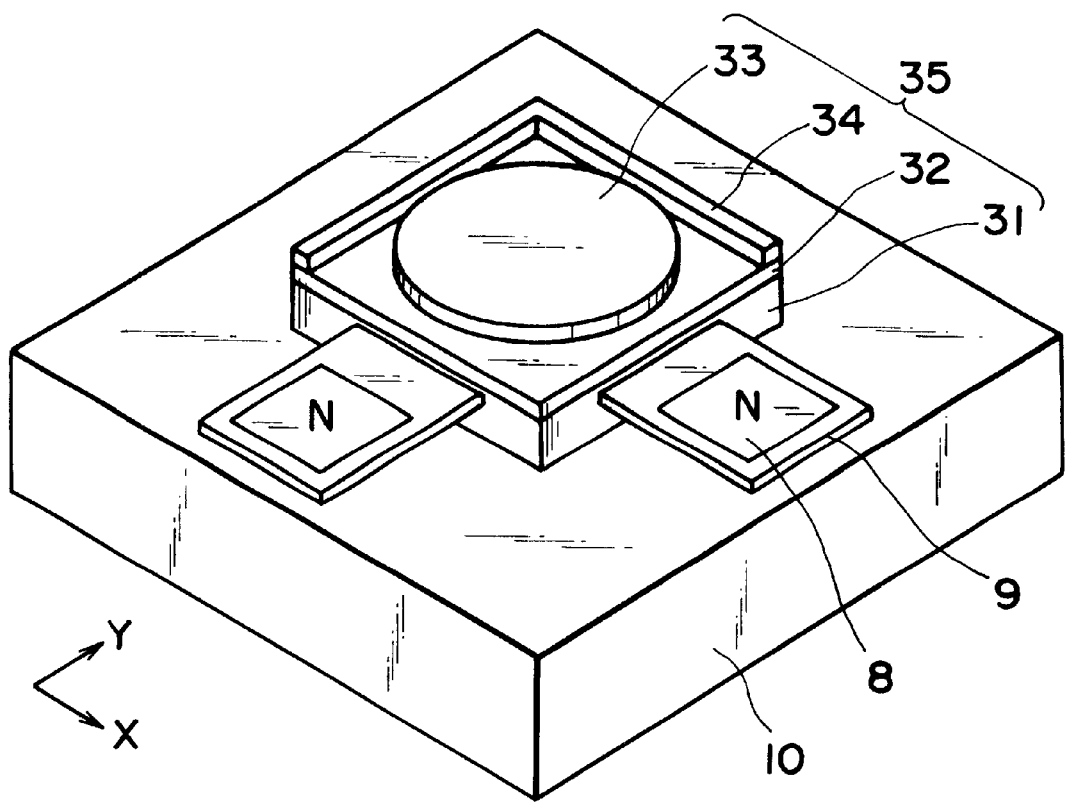
FIG. 9 is a schematic view of a wafer stage, in the stage system of the fifth embodiment.
Figure 10:
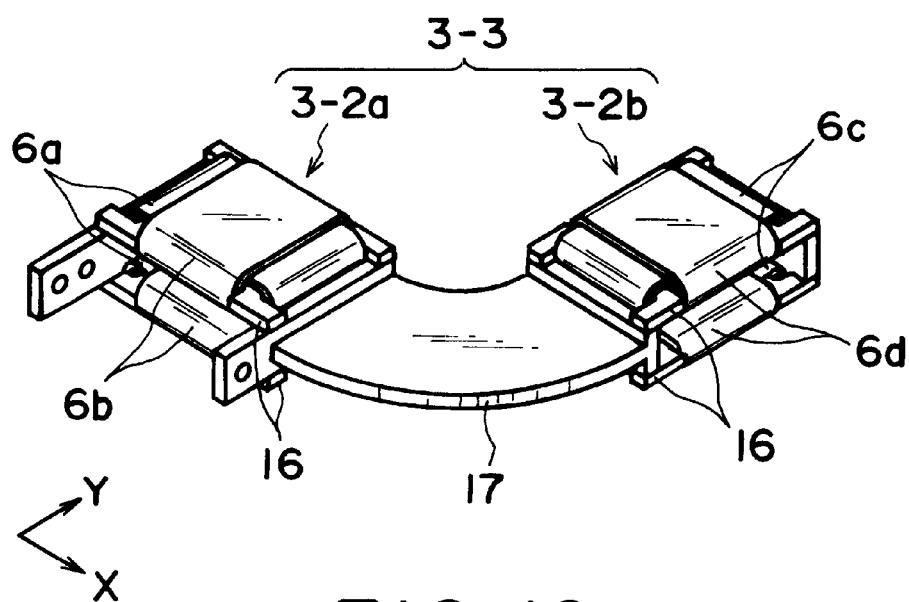
FIG. 10 is a schematic view for explaining details of a movable type three-dimensional stator, in the stage system of the fifth embodiment.

FIG. 8 is a schematic view of an embodiment wherein a stage system according to the present invention is applied to a wafer stage system. FIG. 9 is a schematic view of the wafer stage in this embodiment, and FIG. 10 is a schematic view of a moving type three-dimensional stator in this embodiment.

A surface table 10 is mounted on a base, not shown. On the top surface of the table 10, a slider 31 is supported for sliding motion in a rotational direction and in X and Y directions. The slider 31 is supported without contact thereto, by static bearing means. The slider 31 is provided with a tilt unit 32. The tilt unit 32 is provided with a wafer chuck 33, for carrying thereon a workpiece (not shown), and a right-angle mirror 34. The tilt unit 32 can be moved in a Z tilt direction with respect to the slider, by means of a Z tilt actuator (not shown). Single-pole magnets 8, held by frames 9, are fixed to two adjacent side faces of the slider 31, respectively.

The position of the stage 35 with respect to six-axis direction, can be measured by means of the laser interferometer and the right-angle mirror. There is no mechanical guide for movement along the table top surface. Any deviation of the position in the movement direction with respect to a predetermined target position, is measured by using the laser interferometer, and it is corrected by linear motor means provided on the two side faces and including single-pole magnets. In this embodiment, translational motion along X and Y directions can be made through substantially the same distance.

A moving type three-dimensional stator element 3-3 (coils and yokes of a first driving mechanism) is connected to X and Y moving units 4X and 4Y (second driving mechanism), movably along X and Y directions (two-dimensional directions) without contact to the single-pole movable magnets mounted on the two adjacent side faces of the slider 31.

FIG. 10 shows details of this moving type three-dimensional stator. Basically, it comprises a combination of moving type two-dimensional stator 3-2a and moving type two-dimensional stator 3-2b which are connected with each other with their side plates extending orthogonally. These moving type two dimensional stators 3-2a and 3-2b have substantially the same structure and function as those of the moving type two-dimensional stator 3-2 of the preceding embodiment.

The moving type two-dimensional stator 3-2a comprises single-phase coils 6a for producing thrust in Y direction and single-phase coils 6b for producing thrust in X direction, and these coils are wound around frog-shaped plate-like yokes to provide two two-dimensional coil units. These coil units are connected to each other through side plates 17a and 17b (also serving as connection plate 17). The side faces of the side plates 17a and 17b within the portion included in the moving type two-dimensional stator 3-2a, have its normal substantially perpendicular to the X direction.

The moving type two-dimensional stator 3-2b comprises single-phase coils 6d for producing thrust in the X direction and single-phase coils 6c for producing thrust in the Y direction, and these coils are wound around frog-shaped plate-like yokes to provide two two-dimensional coil units. These coil units are connected to each other through side plates 17c and 17b (also serving as connection plate 17). The side faces of the side plates 17c and 17b within the portion included in the moving type two-dimensional stator 3-2a, have their normal substantially perpendicular to the Y direction.

The X-Y moving unit comprises a Y moving unit 4Y and an X moving unit 4X, mounted on the Y moving unit 4Y.

The Y moving unit 4Y comprises a Y motor 21Y, a Y bracket 22Ya, a Y feed screw 25Y, a Y nut 26Y, a Y guide block 27YR, a Y guide bar 24YR, a Y guide block 27YL, a Y guide bar 24YL, a Y bracket 22Yb, and a guide base 28Y. Y guide bases 28YL and 28YR are fixed to a base (not shown), and Y guide bars 24YL and 24YR are fixed to the Y guide bases 28YL and 28YR. Guide blocks 27YL and 27YR are supported on the Y guide bars 24YL and 24YR, slidably along the Y direction. The Y nut 26Y is connected to the Y guide block 17YR, and also it engages with the Y feed screw 25Y. The Y feed screw 25Y is rotatably supported by bearing means (not shown) of the Y brackets 22Ya and 22Yb. The Y motor 21Y has its stationary portion fixed to the Y bracket 22Ya, and its rotary shaft is connected to the Y feed screw 25Y. The Y guide blocks 27YL and 27YR are fixed to the X moving unit 4X, such that the whole X moving unit is movable along the Y direction. When the Y motor 21Y is actuated to cause rotation of the Y feed screw 25Y, it causes motion of the Y guide block 27Y in the Y direction through the Y guide block 27Y, whereby the whole X moving unit moves along the Y direction.

The X moving unit 4X comprises an X motor 21, an X bracket 22Xa, an X feed screw 25X, an X guide bar 24X, an X nut 26X, and an X bracket 22Xb. Except for the shape of the X brackets 22Xa and 22Xb, these elements have substantially the same structure and function as of those of the stator moving unit 4 of the preceding embodiment.

The moving type three-dimensional stator 3-3 of FIG. 8 is connected to the X moving unit 4X, movably in X direction, through a driving bore and guiding bore b of the side plate 7a and a guiding bore a of the side plate 7b. The connection between the moving type three-dimensional stator 3-3 and the X moving unit 4 is like the connection between the moving type stator and the stator moving unit in the preceding embodiment.

With the structure described above, the moving type three-dimensional stator 3-3 can be moved in the X direction by the X moving unit 4X, while the X moving unit 4X can be moved in the Y direction by the Y moving unit 4Y. As a result, the stator 3-3 can be moved in the X and Y directions.

The single-pole magnets 8 provided on two side faces of the slider are opposed to the stator 3-3 without contact thereto, as described above. Here, these single-pole magnets are disposed substantially at the same distance, in the vertical direction, from the upper and lower frog-shaped plate yokes, such that there is substantially no apparent attraction force applied to the magnet, like the preceding embodiment.

The line of action of the X-direction thrust of the X-direction magnet BX and the line of action of the Y-direction thrust of the Y-direction magnet 8Y, extend approximately through the gravity center of the slider 31.

To move the stage in the X direction in the structure described above, electric currents are applied to the single-phase coils 6c so that a force is produced mainly from the X magnet 8X. Since the line of action of the X-direction thrust of the X magnet passes approximately through the gravity center of the slider 31, substantially no rotational force is produced by the acceleration. In order to correct a small rotational force which might be produced due to a deviation between the line of action and the gravity center, electric currents are applied to the coils 6b to prevent deviation of the rotational amount from a target value. The driving force in the X direction increases in response to application of currents to the coils 6b. However, by reducing the current to the coils 6c by a corresponding amount, the driving force in the X direction can be kept unchanged. As regards precise control of the position or rotational amount, a laser interferometer may be used to perform high precision measurement. Any deviation from a target value may be corrected by using control calculator means, and the result may be applied as an electric current signal to the single-phase coils. This is similar to that of the preceding embodiments.

To move the stage in the Y direction, electric currents are applied to the single-phase coils 6a so that a force is produced mainly from the Y magnet 8Y. Since the line of action of the Y-direction thrust of the Y magnet passes approximately through the gravity center of the slider 31, substantially no rotational force is produced by the acceleration. In order to correct a small rotational force which might be produced due to a deviation between the line of action and the gravity center, electric currents are applied to the coils 6d to prevent deviation of the rotational amount from a target value. The driving force in the Y direction increases in response to application of currents to the coils 6d. However, by reducing the current to the coils 6a by a corresponding amount, the driving force in the Y direction can be kept unchanged. As regards precise control of the position or rotational amount, a laser interferometer may be used to perform high precision measurement. Any deviation from a target value may be corrected by using control calculator means, and the result may be applied as an electric current signal to the single-phase coils. This is similar to that of the preceding embodiments.

Here, the Y motor 21Y is simultaneously actuated to move the stator 3-3 in the Y direction, in synchronism with the motion of the slider 31. Precise movement following control for the moving type stator 3-3 is unnecessary. Open feeding, to prevent contact between the side plate 7a or 7b and the stage side frame 9, holding the single-pole magnets, will be sufficient, like the preceding embodiment.

Simultaneous motions in the X and the Y can be accomplished simply by combining these driving methods.

Also, in this embodiment, similar advantageous results such as no necessity of using laminated steel plates for the yoke, and reduction in size of the yoke, for example, are attainable like the preceding embodiments.

Particularly, in this embodiment, there is a significant advantage that a stage, that provides advantageous results as described above, can be moved in X and Y directions with similar strokes. Further, because of smallness in size and weight of the yoke, this advantage is quite notable when an X-Y stage mechanism of a simple two-level structure is assembled. Additionally, because of lightening in weight of the wafer stage, a higher-speed stage system can be accomplished.

Embodiment 6

Figure 11:
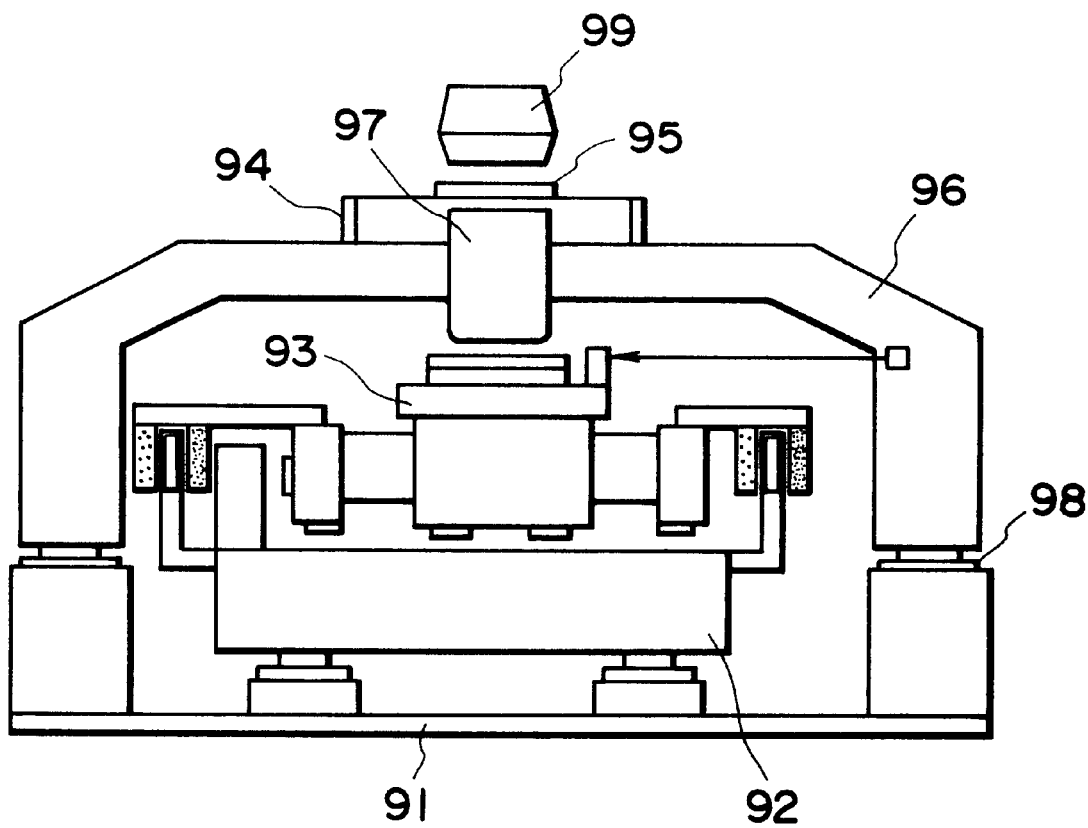
FIG. 11 is a schematic view of an exposure apparatus having a stage system according to the present invention.

Next, referring to FIG. 11, an embodiment of a scan type exposure apparatus into which a stage system according to one of the preceding embodiments is incorporated as a reticle stage or a wafer stage, will be explained.

A barrel base 96 is supported by a floor base 91 through dampers 98. The barrel base 96 serves to support a reticle base table 94, and also it functions to support a projection optical system 97 disposed between a reticle stage 95 and a wafer stage 93. The wafer stage 93 is supported by a stage base table, supported by the floor or the floor base, and it carries a wafer thereon and performs positioning of the same. The reticle stage is supported by a reticle stage base table, supported by the barrel base, and it is movable while carrying a reticle thereon. An illumination optical system 99 produces exposure light with which a wafer placed on the wafer stage 93 is exposed to a reticle placed on the reticle stage 95.

The wafer stage 93 is scanningly moved in synchronism with the reticle stage 95. During scan motion of the reticle stage 95 and the wafer stage 93, their positions are detected continuously by means of laser interferometers, and the results are fed back to driving means for the reticle stage 95 and the water stage 93. With this structure, the scan start positions of the stages can be accurately synchronized with each other and, additionally, the scan speed in the constant-speed scan region can be controlled precisely.

Since in this embodiment the stage system according to any of the preceding embodiments is -used as the reticle stage and/or the wafer stage, the stage weight can be reduced. This ensures a decrease in weight and size of the exposure apparatus. Also, lightening the stage enables higher stage speed and larger throughput of the exposure apparatus.

Embodiment 7

Next, an embodiment of a semiconductor device manufacturing method which uses an exposure apparatus such as described above, will be explained.

Figure 12:
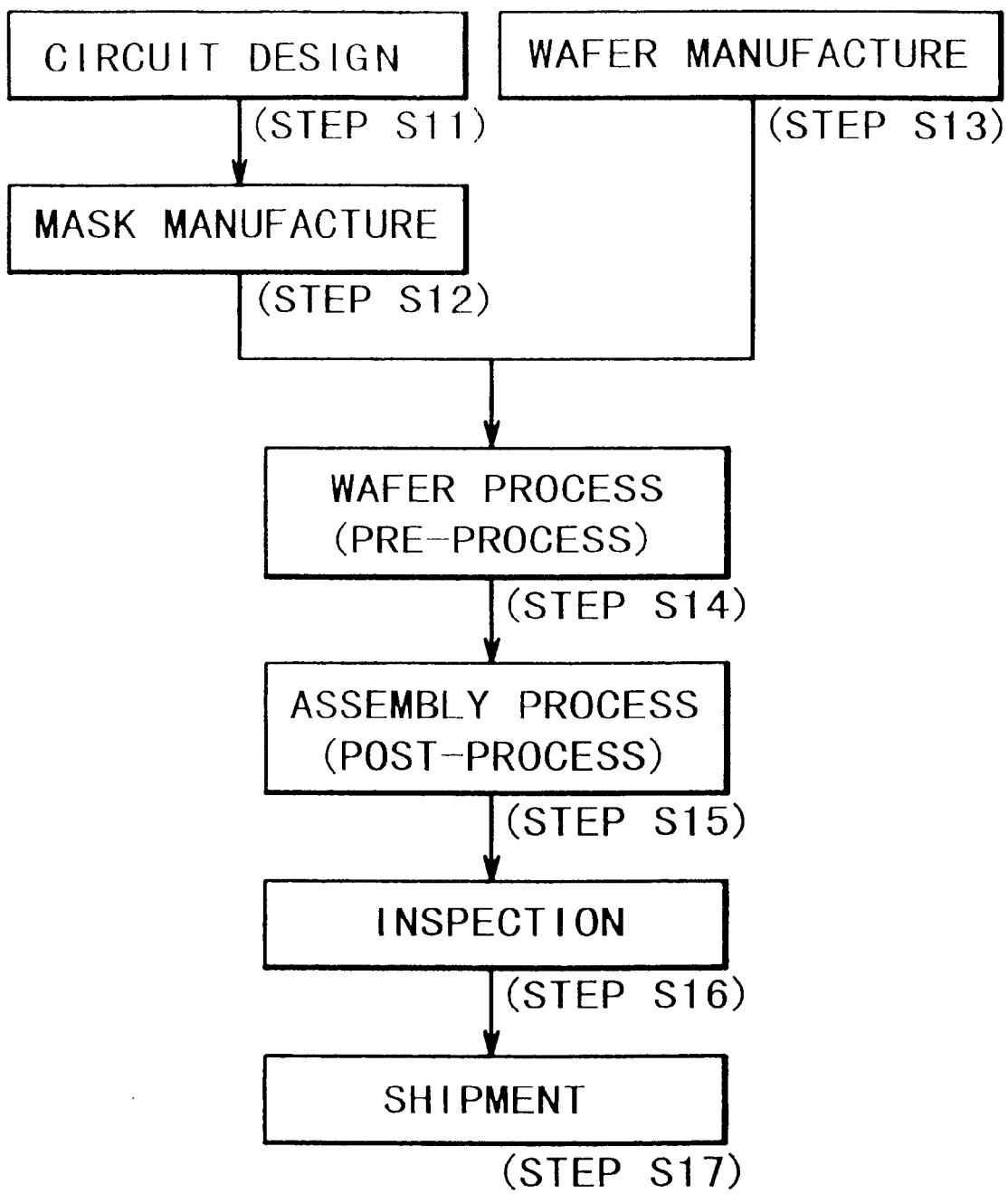
FIG. 12 is a flow chart of semiconductor device manufacturing processes.

FIG. 12 is a flow chart of a procedure for the manufacture of microdevices such as semiconductor chips (e.g., ICs or LSIs), liquid crystal panels, CCDs, thin film magnetic heads or micro-machines, for example.

Step S11 is a design process for designing a circuit of a semiconductor device. Step S12 is a process for making a mask on the basis of the circuit pattern design. Step S13 is a process for preparing a wafer by using a material such as silicon. Step S14 is a wafer process which is called a pre-process wherein, by using the so prepared mask and wafer, circuits are practically formed on the wafer through lithography. Step S15 subsequent to this is an assembling step which is called a post-process wherein the wafer having been processed by step S14 is formed into semiconductor chips. This step includes an assembling (dicing and bonding) process and a packaging (chip sealing) process. Step S16 is an inspection step wherein an operation check, a durability check and so on for the semiconductor devices provided by step S15, are carried out. With these processes, semiconductor devices are completed and they are shipped (step S17).

Figure 13:
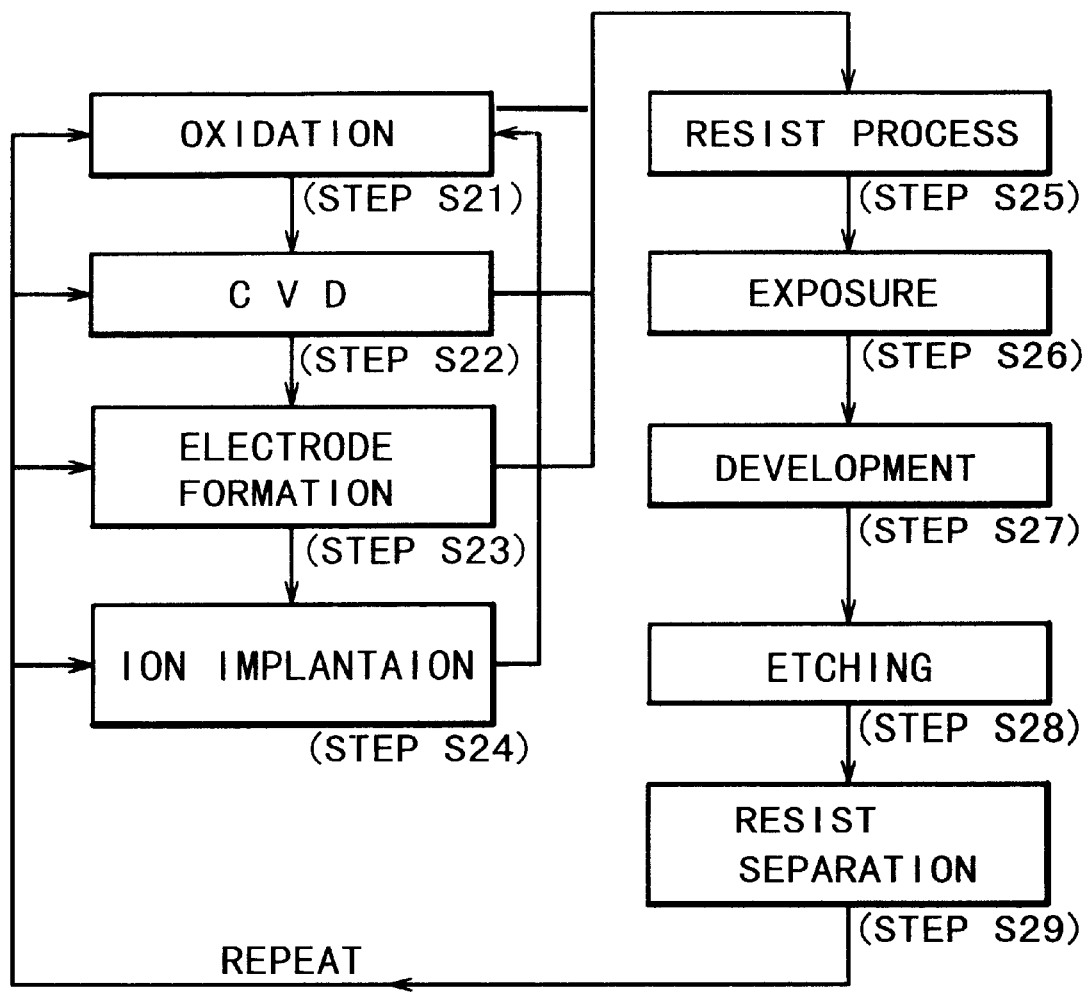
FIG. 13 is a flow chart of a wafer process.
Figure 14:
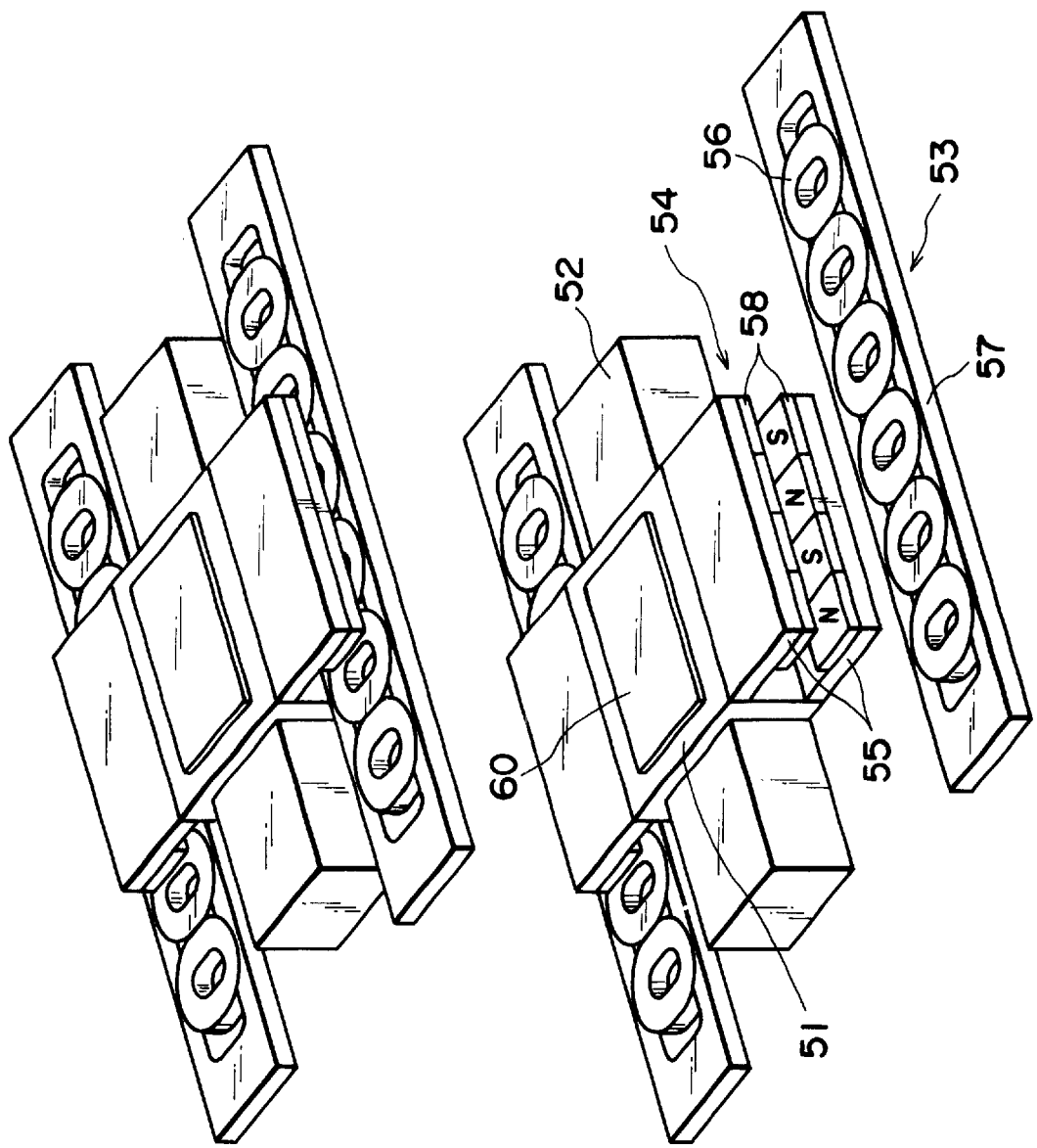
FIG. 14 is a schematic view of an example of a conventional stage system.
Figure 15:
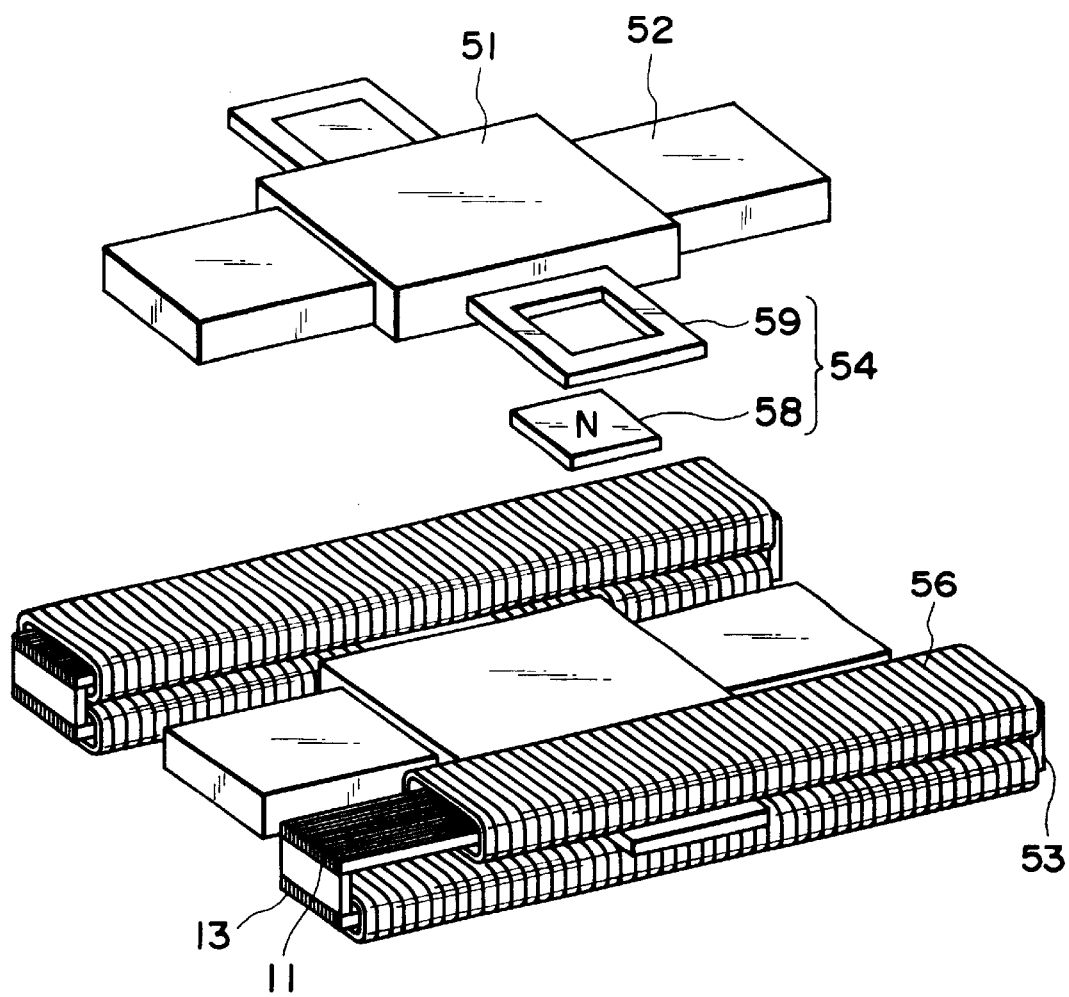
FIG. 15 is a schematic view of another example of a conventional stage system.

FIG. 13 is a flow chart showing details of the water process.

Step S21 is an oxidation process for oxidizing the surface of a wafer. Step S22 is a CVD process for forming an insulating film on the wafer surface. Step S23 is an electrode forming process for forming electrodes upon the wafer by vapor deposition. Step S24 is an ion implanting process for implanting ions to the wafer. Step S25 is a resist process for applying a resist (photosensitive material) to the wafer. Step S26 is an exposure process for printing, by exposure, the circuit pattern of the mask on the wafer through the exposure apparatus described above. Step S27 is a developing process for developing the exposed wafer. Step S28 is an etching process for removing portions other than the developed resist image. Step S29 is a resist separation process for separating the resist material remaining on the wafer after being subjected to the etching process. By repeating these processes, circuit patterns are superposedly formed on the wafer.

With these processes, high density microdevices can manufactured.

In a stage system according to the present invention, during non-contact control of the position and/or speed of a stage, the first driving mechanism can be moved by the second driving mechanism. This enables motion of the first driving mechanism, effective to high precision positioning, in a large stroke. Thus, high-precision stage positioning in a wide range is accomplished. Because of no necessity of coil interchanging, there does not occur thrust ripple, which effectively reduces external disturbance. Further, since there is substantially no relative motion produced between the yoke and the magnet of the first driving mechanism, eddy current resistance can be reduced significantly. Additionally, the size and sectional area of the yoke can be made small, and the weight of the stage can be lightened.

In a stage system according to the present invention, the coil of the first driving mechanism can have substantially the same size as the magnet and, therefore, the yoke to be made integral with the coil can have substantially the same size as the magnet. This effectively assures smallness in size and weight of the coil of the first driving mechanism. Since the portion of the coil which contributes to the thrust is the portion opposed to the magnet, with respect to thrust production, the coil has no useless portion. This reduces heat generation, not required. The size of the yoke can be reduced, and this diminishes deformation of the yoke due to movement of the magnet. High precision positioning can therefore be accomplished.

In a stage system according to the present invention, the yoke can be provided without a laminated structure. This enlarges the degree of freedom in respect to the shape of or supporting method for the yoke. Also, it assures reduction in cost of the stage system.

In a stage system according to the present invention, the first driving mechanism can apply a force to the stage in two-dimensional direction. This enables fine positioning of the stage with respect to two-dimensional directions.

In a stage system according to the present invention, the yoke is formed with recesses at sides thereof. This assures efficient use of a coil wound around the yoke and, therefore, reduction in size and weight of the coil.

In a stage system according to the present invention, coil means which produces driving forces in two directions is provided. This enables that, with coil means, the first driving mechanism produces driving forces in two directions.

In a stage system according to the present invention, the second driving mechanism is movable in a two-dimensional direction. Thus, a portion of the first driving mechanism connected to the second driving mechanism can be moved two-dimensionally. As a result, the movable member to be moved can be moved two-dimensionally, with a large stroke.

While the invention has been described with reference to the structures disclosed herein, it is not confined to the details set forth and this application is intended to cover such modifications or changes as may come within the purposes of the improvements or the scope of the following claims.

What is claimed is:

1. A stage system, comprising:
   a movable stage;
   a first driving mechanism, having a magnet and a coil unit, for moving said stage along a predetermined direction, said coil unit including a coil and a yoke, wherein said magnet is connected to the stage side; and
   a second driving mechanism for moving said coil unit along the predetermined direction,
   wherein, while a position or a speed of said stage is controlled as said stage is driven through said first driving mechanism, said coil unit is moved substantially in synchronism with said stage.

2. A stage system according to claim 1, wherein said second driving mechanism includes a feed screw.

3. A stage system according to claim 1, wherein said second driving mechanism includes a linear motor.

4. A stage system according to claim 1, wherein said magnet and said coil have substantially the same size with respect to the movement direction.

5. A stage system according to claim 1, wherein said yoke comprises a ferromagnetic material of a flat plate shape.

6. A stage system according to claim 1, wherein said coil is wound around said yoke.

7. A stage system according to claim 1, wherein said coil comprises a flat coil.

8. A stage system according to claim 1, wherein said first driving mechanism includes a plurality of coils.

9. A stage system according to claim 1, wherein said first driving mechanism moves said stage two-dimensionally.

10. A stage system according to claim 1, wherein said coil comprises a first coil for producing a driving force in a first direction with respect to said magnet, and a second coil for producing a driving force in a second direction with respect to said magnet.

11. A stage system according to claim 1, wherein said second driving mechanism is operable to move, two-dimensionally, one of said magnet and said coil of said first driving mechanism as connected to said second driving mechanism.

12. A stage system according to claim 1, wherein said yoke has a recess formed in a peripheral portion thereof.

13. An exposure apparatus, comprising:
    a stage being movable while holding one of a wafer and a reticle thereon;
    a first driving mechanism, having a magnet and a coil unit, for moving said stage along a predetermined direction, said coil unit including a coil and a yoke, wherein said magnet is connected to the stage side; and
    a second driving mechanism for moving said coil unit along the predetermined direction,
    wherein, while a position or a speed of said stage is controlled as said stage is driven through said first driving mechanism, said coil unit is moved substantially in synchronism with said stage.

14. A device manufacturing method, comprising the steps of:
    providing an exposure apparatus as recited in claim 13; and
    transferring a pattern of a reticle into a wafer.

15. A method according to claim 14 further comprising:
    applying a photosensitive material to the wafer before exposure; and
    developing the wafer after the exposure.

16. An exposure apparatus according to clams 13, wherein said second driving mechanism includes a feed screw.

17. An exposure apparatus according to claim 1, wherein said second driving mechanism includes a linear motor.

18. An exposure apparatus according to claim 13, wherein said magnet and said coil have substantially the same size with respect to the movement direction.

19. An exposure apparatus according to claim 13, wherein said yoke comprises a ferromagnetic material of a flat plate shape.

20. An exposure apparatus according to claim 13, wherein said coil is wound around said yoke.

21. An exposure apparatus according to claim 13, wherein said coil comprises a flat coil.

22. An exposure apparatus according to claim 13, wherein said first driving mechanism includes a plurality of coils.

23. An exposure apparatus according to claim 13, wherein said first driving mechanism moves said stage two-dimensionally.

24. An exposure apparatus according to claim 13, wherein said coil comprises a first coil for producing a driving force in a first direction with respect to said magnet, and a second coil for producing a driving force in a second direction with respect to said magnet.

25. An exposure apparatus according to claim 13, wherein said second driving mechanism is operable to move, two-dimensionally, one of said magnet and said coil of said first driving mechanism as connected to said second driving mechanism.

26. An exposure apparatus according to claim 13, wherein said yoke has a recess formed in a peripheral portion thereof.

* * * * *

UNITED STATES PATENT AND TRADEMARK OFFICE
CERTIFICATE OF CORRECTION

PATENT NO. : 6,479,991 B1
DATED : November 12, 2002
INVENTOR(S) : Nobushige Korenaga It is certified that error appears in the above-identified patent and that said Letters Patent is hereby corrected as shown below:

Column 1,
Line 40, "In" should read -- in --.
Lines 51 and 53, "show." should read -- shown. --.
Line 54, "stage," should read -- stage. --.
Line 57, "colis" should read -- coils --.
Line 59, "wounded" should read -- wound --.

Column 2,
Line 13, "plages" should read -- plates --.
Line 19, "stoke," should read -- stroke --.

Column 3,
Line 40, "inventions." should read -- invention. --.

Column 5,
Line 27, "to" should read -- in --.

Column 6,
Line 33, "to" should read -- in --.
Lines 36-47, should be changed to read as follows:
-- There is no relative motion between the yoke 5 and the magnet 8 (magnet means of the first driving mechanism) for driving the stage 1. This effectively reduces the eddy current resistance attributed to the relative motion between the yoke and the magnet. Thus, the yoke can be made by a single structure of a plate-like member of a ferromagnetic material. This avoids the necessity of using laminated steel plates which are difficult to be assembled or supported. The stage system can, therefore, be made simple and inexpensive. Without the necessity of a laminated structure for the yoke, the degree of freedom for the shape design of the yoke is large. --.
Line 59, after "cable." the right margin should be closed.
Before line 60, a new line should be inserted -- Embodiment 2 --.

Column 7,
Line 17, "adove," should read -- above, --.
Line 51, "is" should read -- be --.

Column 8,
Lines 8 and 9, "in" should read -- in a --.

Column 9,
Lines 51 and 53, "oblong-shape" should read -- oblong-shaped --.

UNITED STATES PATENT AND TRADEMARK OFFICE
CERTIFICATE OF CORRECTION

PATENT NO. : 6,479,991 B1
DATED : November 12, 2002
INVENTOR(S) : Nobushige Korenaga It is certified that error appears in the above-identified patent and that said Letters Patent is hereby corrected as shown below:

Column 10,
Line 10, "in" should read -- in a --.
Line 25, "ferromacnetic" should read -- ferromagnetic --.
Line 51, "direction," should read -- directions, --.

Column 11,
Lines 10 and 11, "in" should read -- in the --.
Line 17, "its" should read -- their --.

Column 12,
Line 15, "BX" should read -- 8X --.

Column 13,
Line 1, "Y" should read -- Y directions --.
Line 46, "-used" should read -- used --.

Column 14,
Line 12, "water" should read -- wafer --.
Line 32, "manufactured." should read -- be manufactured. --.
Line 62, "in" should read -- with --.
Line 67, "in" should read -- in a --.

Column 16,
Line 30, "claim 1," should read -- claim 13, --.

Signed and Sealed this

Third Day of February, 2004

JON W. DUDAS
*Acting Director of the United States Patent and Trademark Office*